United States Patent [19]

Crafts

[11] Patent Number: 5,288,949
[45] Date of Patent: Feb. 22, 1994

[54] CONNECTION SYSTEM FOR INTEGRATED CIRCUITS WHICH REDUCES CROSS-TALK

[75] Inventor: Harold S. Crafts, Colorado Springs, Colo.

[73] Assignee: NCR Corporation, Dayton, Ohio

[21] Appl. No.: 829,838

[22] Filed: Feb. 3, 1992

[51] Int. Cl.$^5$ ............................................. H05K 1/00
[52] U.S. Cl. ............................ 174/250; 174/117 M; 361/778
[58] Field of Search ............... 174/117 F, 117 M, 250, 174/255, 260; 361/397, 410, 412, 414, 416, 406; 357/70, 71; 333/243, 236

[56] References Cited

U.S. PATENT DOCUMENTS

| | | | |
|---|---|---|---|
| 4,143,236 | 3/1979 | Ross et al. | 174/117 F |
| 4,322,778 | 3/1982 | Barbour et al. | 361/414 |
| 4,463,323 | 7/1984 | Piper | 174/117 M |
| 4,498,122 | 2/1985 | Rainal | 361/414 |
| 4,560,962 | 12/1985 | Barrow | 361/410 X |
| 4,620,264 | 10/1986 | Ushifusa et al. | 361/414 |
| 4,803,595 | 2/1989 | Kraus et al. | 361/412 |
| 4,831,497 | 5/1989 | Webster et al. | 361/406 X |
| 4,866,507 | 9/1989 | Jacobs et al. | 361/412 |
| 4,894,708 | 1/1990 | Watari | 357/70 X |
| 4,901,136 | 2/1990 | Neugebauer et al. | 357/70 X |
| 4,904,968 | 2/1990 | Theus | 174/250 X |
| 5,184,210 | 2/1993 | Westbrook | 174/253 X |

Primary Examiner—Leo P. Picard
Assistant Examiner—Cheryl R. Figlin
Attorney, Agent, or Firm—Gregory A. Welte

[57] ABSTRACT

The invention concerns a Multi-Chip Module (MCM), which can be viewed as similar to a printed circuit board, but with the conductors interwoven in a 3-dimensional array. In the invention, the conductors are arranged such that both power supply conductors and ground conductors are interwoven around signal conductors, and provide shielding for the signal conductors, thus reducing cross-talk.

8 Claims, 9 Drawing Sheets

▨ Vss
▩ Vdd
▨ SIGNAL METAL 1
▥ SIGNAL METAL 2
▨ POWER VIA
▨ GROUND VIA
▨ SIGNAL VIA

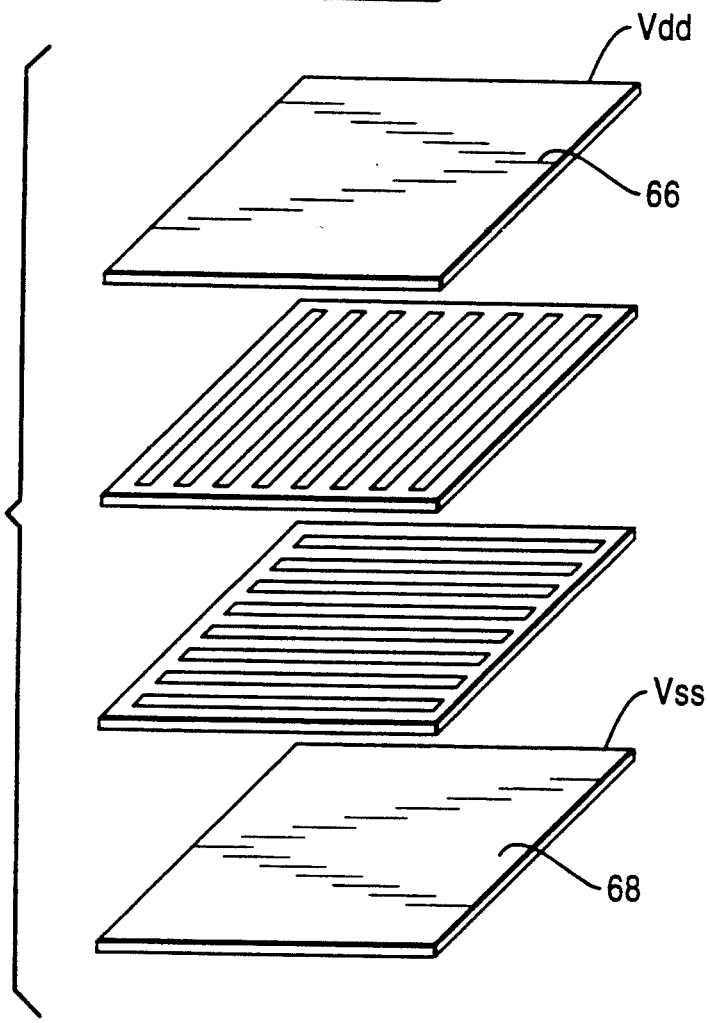
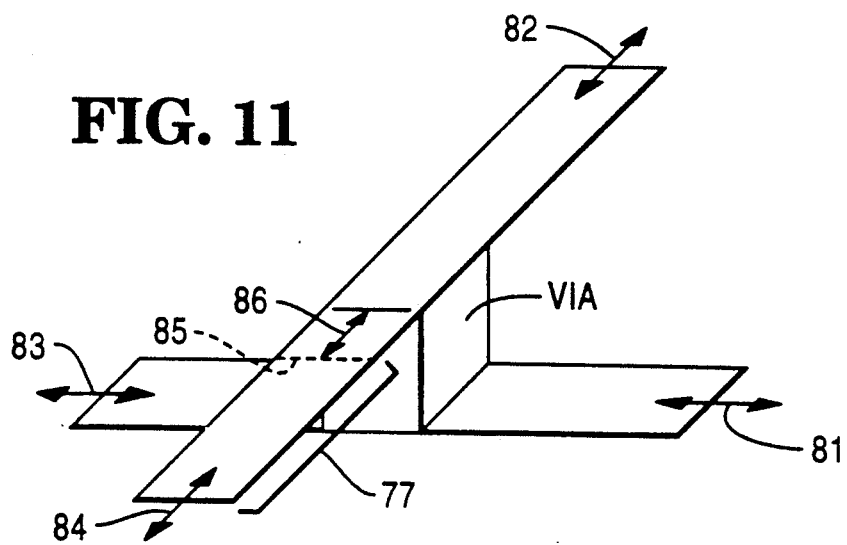

CONNECTION SYSTEM FOR INTEGRATED CIRCUITS WHICH REDUCES CROSS-TALK

The invention concerns systems of conductors for interconnecting integrated circuits which are mounted on a carrier, such as a Multi-Chip Module, or MCM.

BACKGROUND OF THE INVENTION

FIGS. 1 and 2 illustrate a Multi-Layer Ceramic Module (MCM), which carries integrated circuits (ICs). The MCM resembles a printed circuit board in the aspects of providing mounts for the ICs and in providing conductors for interconnecting the ICs. The MCM includes a ceramic substrate 3, which contains conductors 6 leading to pads 4 for the ICs in FIG. 2. The conductors are arranged in two layers, such that the conductors on one layer are transverse to those on the other. The transverse conductors cause less cross-talk, because there are fewer flux linkages between transverse conductors than between parallel conductors.

The inventor has found that this configuration presents the following two problems. One, there is a minimum spacing required between conductors. If the conductors are positioned closer than the minimum, the signals on neighboring conductors interfere with each other, and cross-talk occurs. For frequencies in the range of 25 to 100 MegaHertz (MHz), a spacing, indicated in FIG. 2, of 75 micrometers ($\mu$M) between conductors which are 25 $\mu$M wide has been found necessary in many cases.

Two, there is a limit on the maximum length over which adjacent conductors can run parallel. If the conductors' parallel run exceeds this limit, the mutual coupling between the conductors causes additional cross-talk. In order to eliminate this additional cross-talk, no parallel run should exceed 10 centimeters.

OBJECTS OF THE INVENTION

It is an object of the invention to provide an improved carrier of the MCM type for ICs.

It is a further object to provide an improved system of conductors on MCMs.

It is a still further object to provide a system of interconnections for ICs having reduced cross-talk.

BRIEF DESCRIPTION OF THE DRAWINGS

FIG. 9 illustrates a prior art device, which uses plates and 68 for shielding.

FIG. 11 illustrates a junction formed by a via.

SUMMARY OF THE INVENTION

In one form of the invention, in a carrier for ICs, such as a Multi-layer Ceramic Module (MCM), the three functions of (1) power supply to the ICs, (2) signal transmission to and from the ICs, and (3) shielding of the signal transmitting conductors are all accomplished by conductors located on only two layers, together with interconnections between these conductors.

DETAILED DESCRIPTION OF THE INVENTION

Figure 3:
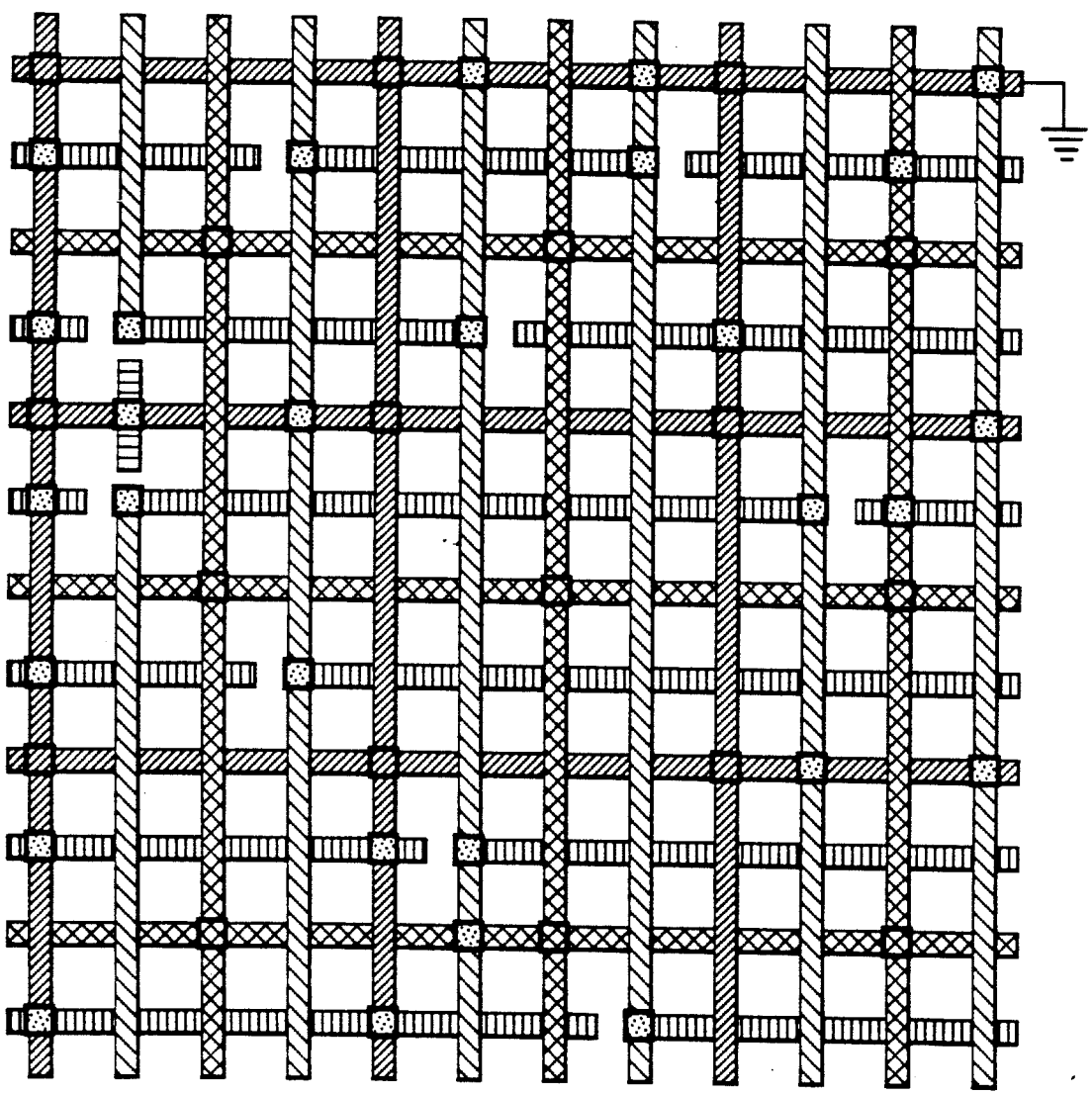
FIG. 3 illustrates an x-ray view of two layers of conductors. The view is a representative view of the two layers shown in FIG. 3A, which shows a larger part of the two layers.
Figure 3A:
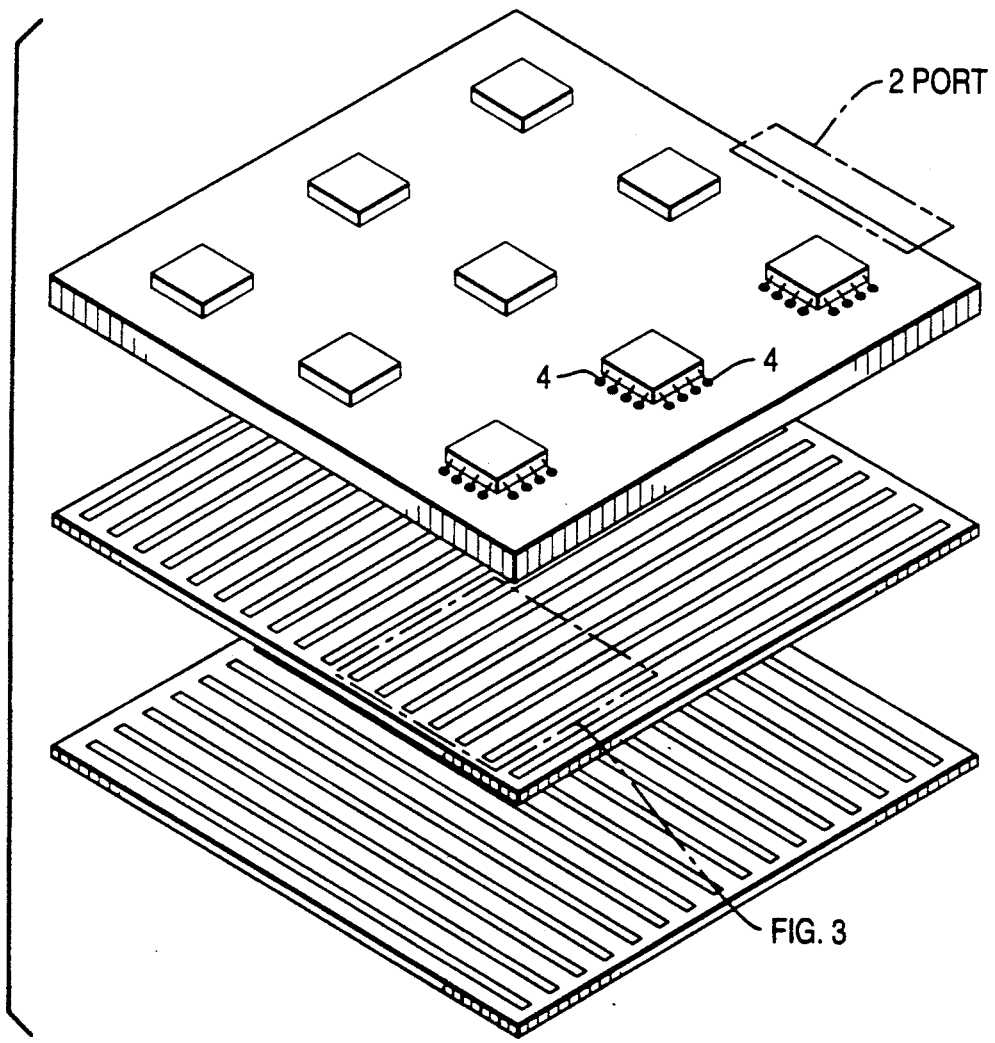

One form of the invention, shown in FIG. 3, will be explained by first describing the individual components, and then by describing how these components are assembled together. FIG. 3 shows a representative region of a larger interconnection system shown in FIG. 3A. The system includes both signal lines and power lines interconnecting among the ICs and also connecting to the port 2 where the signals and power connect with external components, such as other MCMs.

Figure 4:
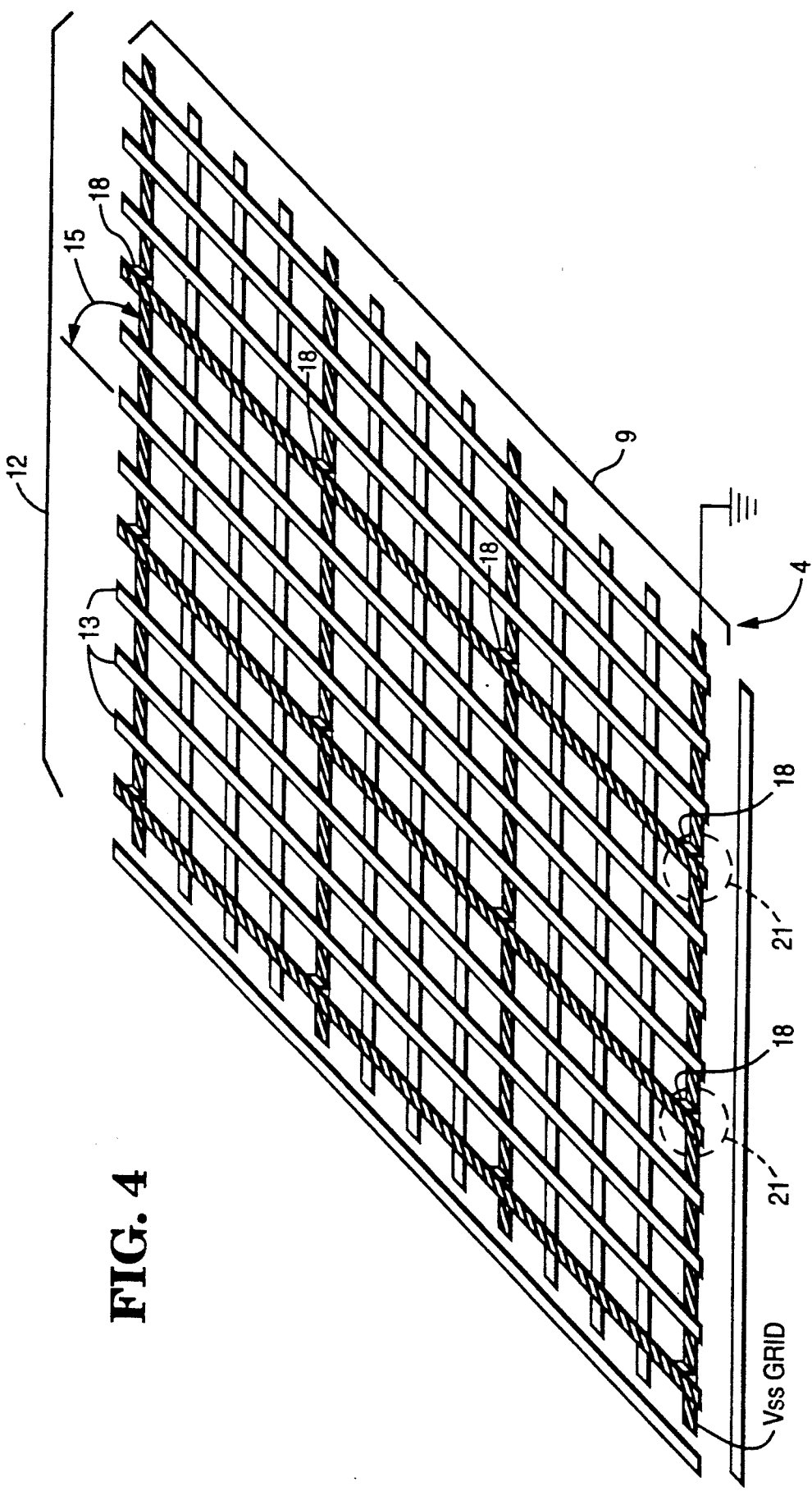
FIGS. 4-6 illustrate perspective views of the apparatus of FIG. 3, with different components shaded differently.
Figure 5:
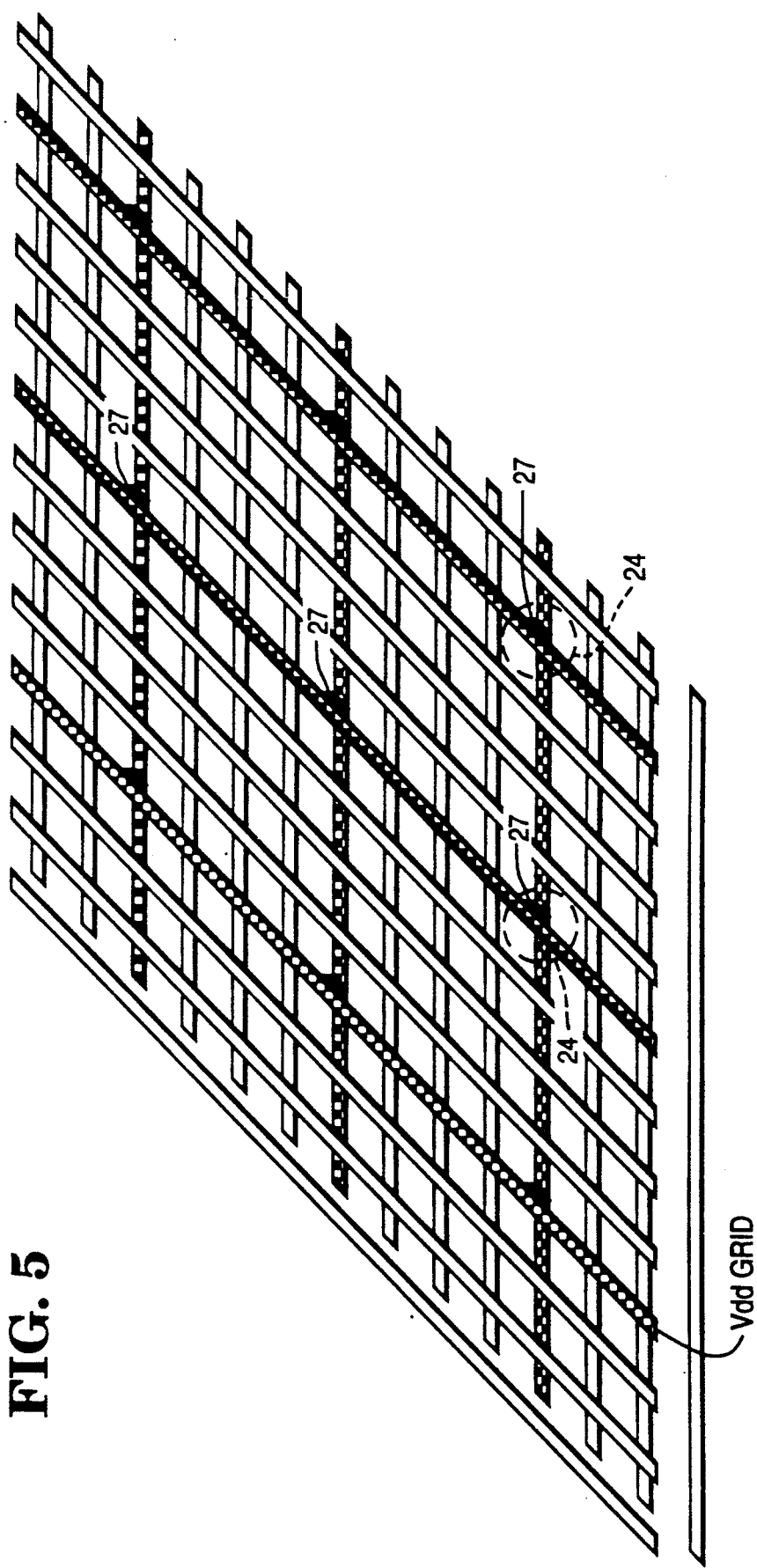
Figure 6:
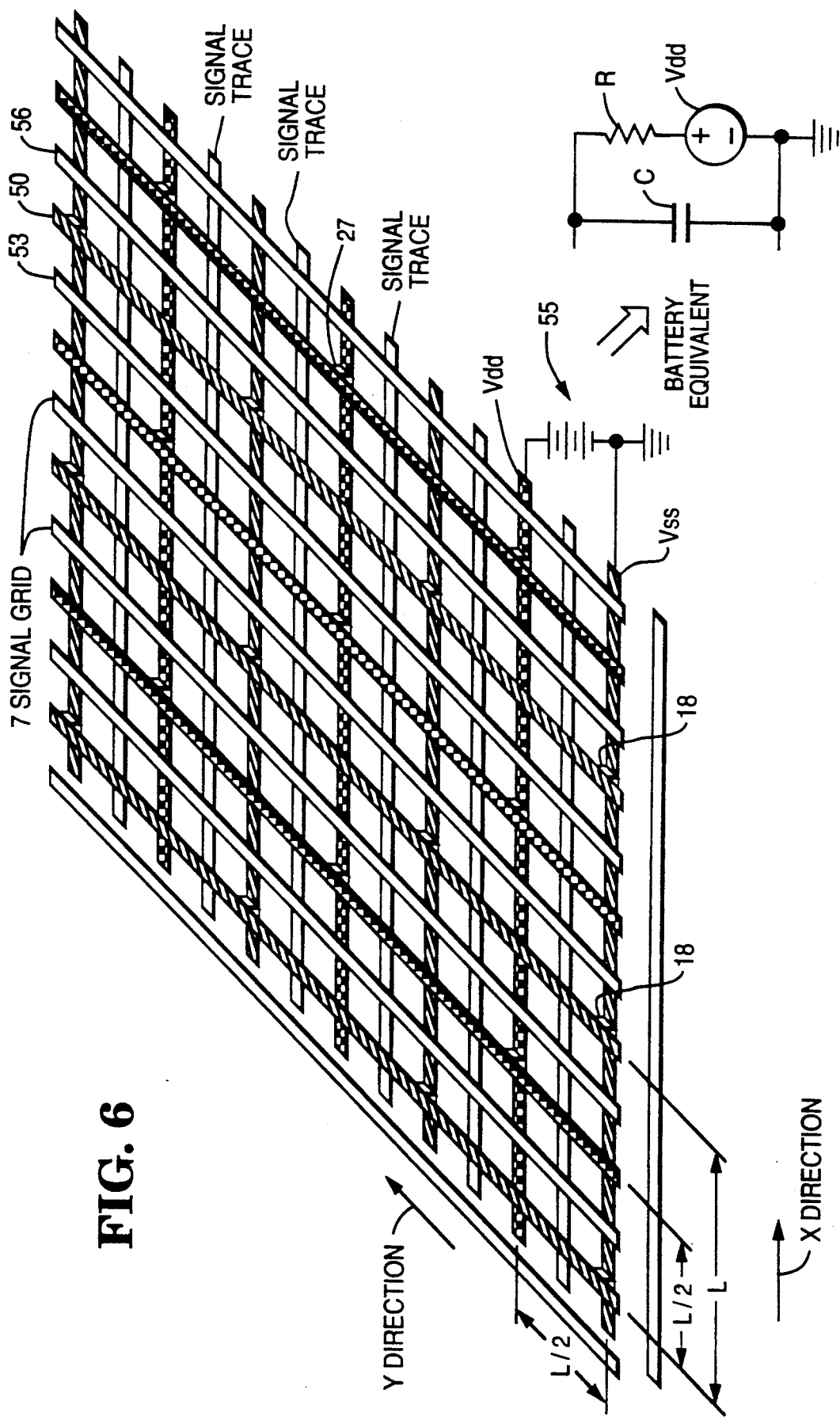

FIGS. 4-6 each show the same gridwork of conductors, but with different sets of conductors emphasized in different Figures, for ease of explanation. FIG. 4 shows two layers 9 and 12 of parallel traces 13. The traces are arranged such that the traces on one layer are transverse to those on the other; preferably, angle 15 is ninety degree.

As the explanation of FIGS. 4-6 will show, each layer contains two types of traces, namely, signal traces and power traces. Further, there are two types of power trace, namely, one held at a voltage of $V_{ss}$ (connected to the sources of the N-channel Field Effect Transistors, FETs) and another held at $V_{dd}$ (connected to the sources of the P-channel FETs).

Figure 8:
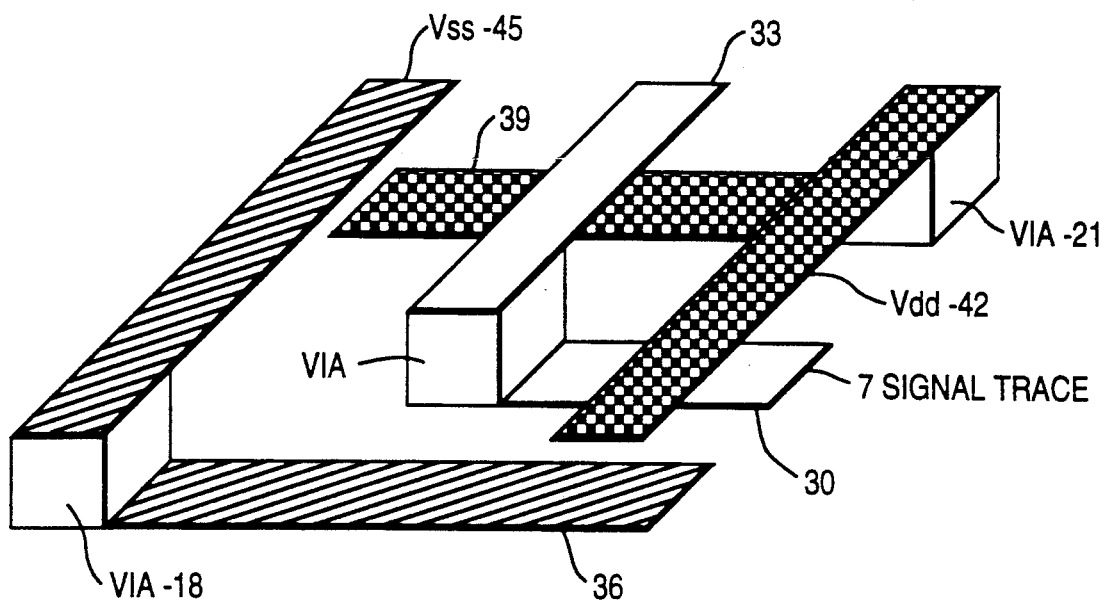
FIG. 8 is an enlarged view of a signal trace 7.

In FIG. 4, the $V_{ss}$ traces (i.e., every fourth trace) are indicated by solid shading. Each $V_{ss}$ trace in the top layer 12 is connected by vias 18 at each crossing point over each $V_{ss}$ trace on the bottom layer. The vias are shown in more detail in FIG. 8. The $V_{ss}$ traces in FIG. 4 are held at ground potential, as indicated by the ground symbol 4.

Similarly, the $V_{dd}$ power traces (again, every fourth trace), shown in FIG. 5 and indicated by stippled shading, are also connected at their crossing points 24 by vias 27. The $V_{ss}$ and the $V_{dd}$ traces are shown in their assembled configuration in FIG. 6. These two sets of power traces form identical, but offset, grids. One grid is indicated by the solid shading, and the other by stippled shading. The offset is related to the spacing L between the individual conductors in each grid. That is, the grids are offset by distance L/2 in both the x-direction and the y-direction, as indicated.

Figure 7:
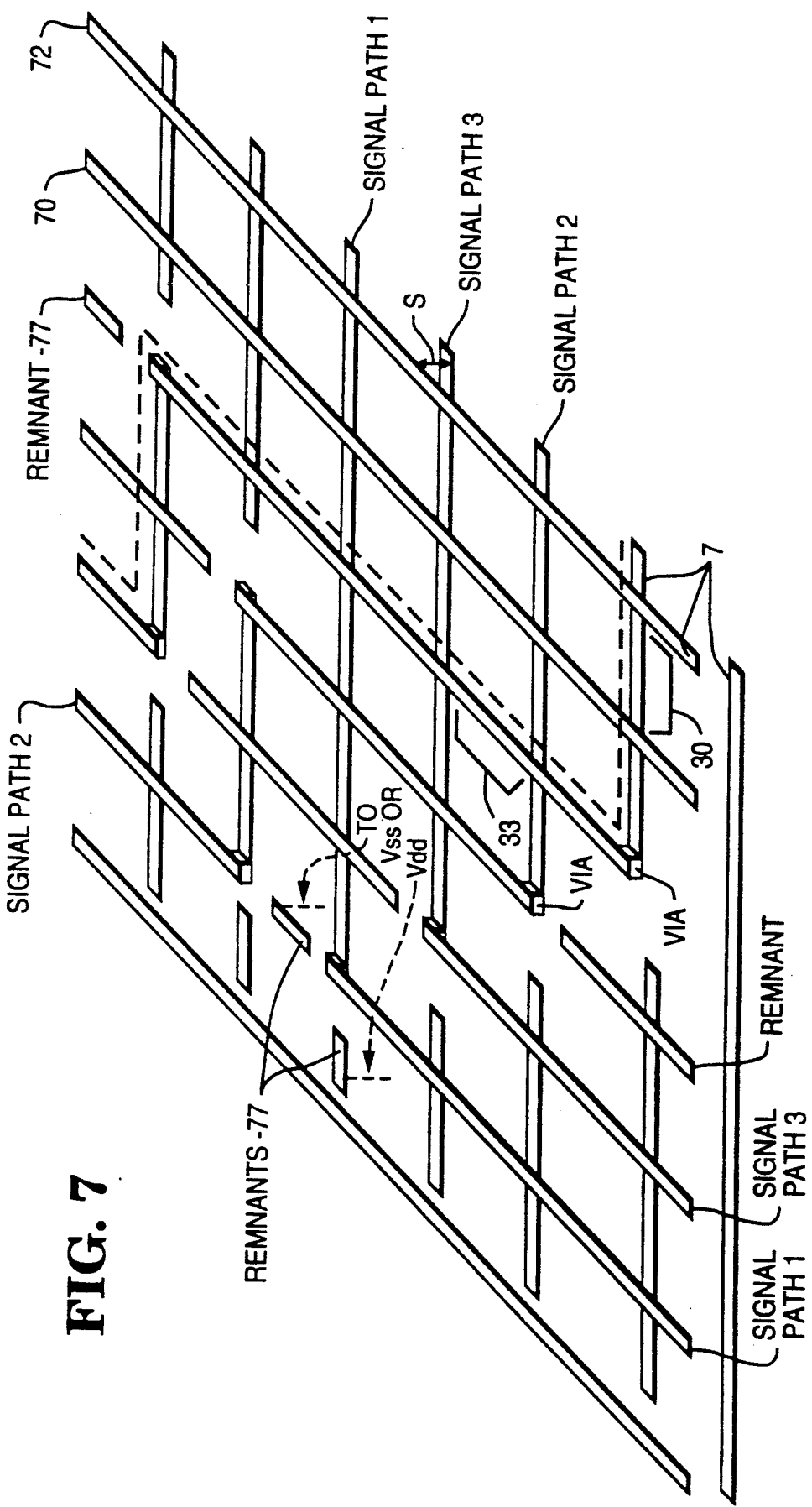
FIG. 7 illustrates how the signal traces 7 in FIGS. 4-6 are cut and re-connected in order to form signal pathways.

The remaining, unshaded traces in FIG. 6 carry signals. However, the configuration of FIG. 6 is not the final configuration for the signal traces, but the starting point for explanatory purposes. The signal traces 7 are modified to form signal paths by cutting the traces, and re-connecting them by vias, as indicated in FIG. 7. That is, the gridwork of signal traces in FIG. 6 is chopped up, and reconnected by vias in order to form a collection of signal paths which interweave through the pair of power grids shown in FIG. 6. In FIG. 7, one exemplary signal path is indicated by a dashed line, and three other signal paths are designated.

IMPORTANT CONSIDERATIONS

Several important features of the invention are the following.

1. The device is constructed using fabrication techniques well known in the integrated circuit industry. The ICs are connected to the MCM using wire bonding or Tape Automated Bonding techniques (TAB), known in the art.

2. Each signal trace, along nearly its entire length, is flanked by a pair of power supply grids. This flanking shields the signal trace and reduces cross-talk among the signal traces. That is, for example, each signal trace can be conceptually broken into the following three types of components:

A) "horizontal" sections 30 in FIG. 7;

B) "vertical" sections 33; and

C) vias, which are connectors connecting the horizontal and vertical sections. The vias are equal in length to the spacing S between the pair of layers, but are generally of greater cross-sectional area than either the first or second types of section.

As to flanking, each of these three components (horizontal sections, vertical sections, and vias) is located between, and shielded by, two or more conductors of the power supply grid. Specifically, in FIG. 8, "horizontal" section 30 is flanked by the two conductors 36 and 39; "vertical" section 33 is flanked by the two conductors 42 and 45; and the via is flanked by two power grid vias 18 and 21.

In this connection, two facts are noted. First, more remote parts of the power grids also provide some shielding, but the closest (i.e., flanking) conductors shown in FIG. 8 will provide the majority of the shielding function.

Second, each power grid conductor can be involved in flanking more that one signal conductor. For example, conductor 50 in FIG. 6 shields both signal traces 53 and 56.

3. One explanation for the shielding is the following. The power grid $V_{ss}$ is held at ground potential, and the other power grid $V_{dd}$ is held at a voltage, such as 5 volts, by a power source, represented as a battery 55 in FIG. 6. The battery can be represented by the combination of an ideal voltage source $V_{dd}$, a resistance R, and a capacitance C, as indicated.

The capacitance C is quite large, making the impedence-to-ground from the $V_{dd}$ grid very small for high frequency signals. (Impedance, in this case, is proportional to $1/(C \times f)$, wherein C is the capacitance C in FIG. 6 and f is the frequency.) That is, at the a.c. frequencies of interest (in the range of 20 to 100 Mhz), the $V_{dd}$ grid is effectively a short-to-ground, although the $V_{dd}$ grid is insulated from ground as to d.c. signals.

Thus, the $V_{dd}$ grid shunts to ground the high frequency signals which it collects, and prevents these signals from being picked up by nearby signal traces. In a simplified sense, the $V_{dd}$ power grid acts as an antenna connected to ground for collecting radiation emanating from the signal traces.

The $V_{ss}$ grid is directly connected to ground, and also acts as a shunt for high frequency signals. Therefore, in FIG. 8, each of the two sections 30 and 33 and the via are flanked by an a.c. ground.

In addition to the shunting to ground just described, the power grids also provide an amount of Faraday shielding for the signal traces.

Figure 1:
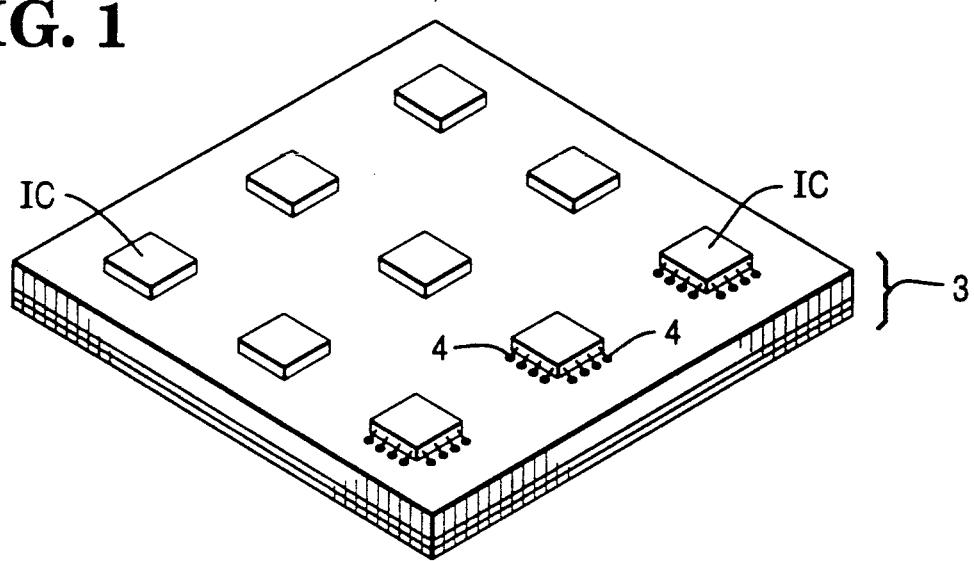
FIGS. 1 and 2 illustrate an MCM as known in the art.
Figure 2:
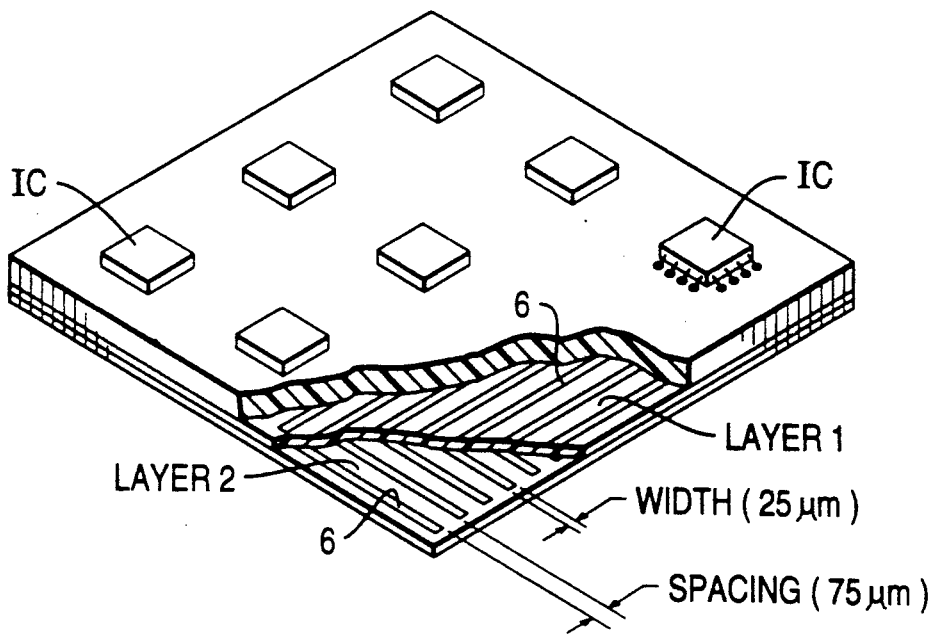

4. The invention provides an economic advantage over the prior art approaches. That is, one prior art approach sandwiches the traces of FIG. 2 between conductive plates 66 and 68, as shown in FIG. 9. The plates act as both power supply connectors and shields. In this approach, as mentioned in the Background of the Invention, it has been found that, for traces of width of about 25 $\mu$M, at frequencies of about 20 to 100 MHz, the minimum spacing allowed between adjacent traces is about 75 $\mu$M.

In this prior-art spacing, only one-fourth of the surface area of the MCM is covered by the signal traces; the rest (i.e., the 75 $\mu$M spacings) is blank. The invention eliminates this wasted blank space by positioning the power supply grids in the space, and eliminating the plates. That is, for example, the $V_{dd}$ plate in FIG. 9 is eliminated, and replaced by the $V_{dd}$ grid in FIG. 6.

This replacement provides a three-fold benefit: (1) the plates, together with their size, weight, and cost, are eliminated; (2) the formerly wasted 75 $\mu$M space is now eliminated: the space is occupied by the power grids; and (3) the limit on parallel runs, described in the Background of the Invention, has been relaxed, because now the signal traces are shielded by the power grids. Now, the primary limit on the length of parallel runs is the size of the MCM. Presently, in commonly used MCMs, this limit is about six inches.

Further, because the power grids are positioned between individual conductors, it can be expected that the spacing between adjacent signal traces, such as traces 70 and 72 in FIG. 7, can be reduced below the 75 $\mu$M spacing described above. For example, for signals in the range of 20 to 100 MHz, a spacing of 10 $\mu$M–25 $\mu$M can be used.

5. As discussed above, the $V_{ss}$ and $V_{dd}$ grids in FIG. 6 function as ground planes. However, because the Inventor's grid surface area is significantly less than the prior-art plate surface area in FIG. 9, the capacitance of the Inventor's grids is significantly less than that of the prior-art plates. Consequently, the transmission line impedance of the Inventor's signal traces, such as traces 53 and 56 in FIG. 6, is significantly greater than that of the prior-art system, because line impedance is inversely propoprtional to the square root of line capacitance. (Impedence, $Z_0$, equals $\sqrt{(L/C)}$ in the present case.) The higher impedence is desirable because it causes the signal lines to draw less current from the circuitry which drives them.

Stated in simpler terms, the signal traces in the invention have lower capacitance and thus higher impedance than the prior art system.

Figure 10:
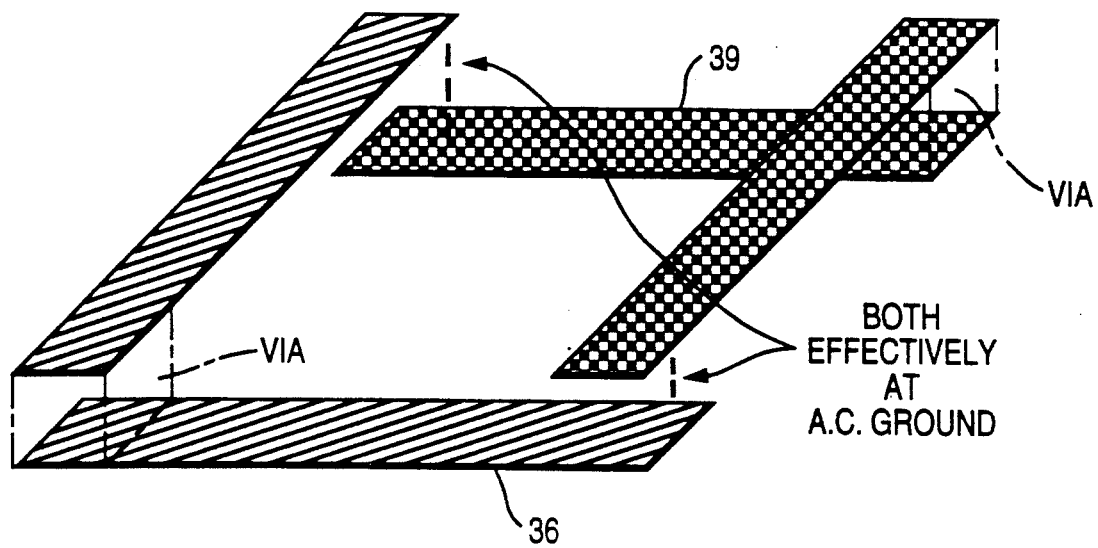
FIG. 10 illustrates a unit cell. The gridwork shown in FIG. 6 can be conceived as constructed of such unit cells.

6. The power supply grids $V_{ss}$ and $V_{dd}$ can be viewed as forming a periodic array of identical unit cells. One unit cell is shown in FIG. 10. Even though the edges of the cell (e.g., conductors 36 and 39) are composed of conductors held at different dc potentials, namely, $V_{dd}$ and $V_{ss}$, these edges nevertheless form a.c. grounds for high-frequency signals, as discussed above. Thus, for shunting purposes, the $V_{ss}$ and $V_{dd}$ traces can be viewed as electrically connected, as indicated by the dashed lines in FIG. 10, to form a single unit cell.

Viewed another way, from a simplified point of view, the capacitance and inductance of the "edge" conductors in FIG. 10 are not affected by the d.c. potential of the "edge" conductors. The capacitance and inductance determine the impedance of the transmission line in question.

The periodic cell structure provides two significant effects. One, the measured impedance of all signal traces will be nearly the same, because each signal line passes through a similar environment en route from its entry port 2 in FIG. 3A. Two, the local, point-to-point impedence along each signal trace will vary in a regular, periodic manner, and the variations themselves will be minimal.

7. After the signal traces have been formed, remnants 77 of the former signal trace grid in FIG. 7 will be left over. In general, it will not be feasible to remove the remnants. However, the remnants should not be ignored, because they will reflect signals, in the way that radar "chaff" reflects radar signals. To reduce these reflections, the remnants are connected to one or the other of the power grids $V_{dd}$ or $V_{ss}$.

The entire remnant population should not be connected to either $V_{dd}$ or $V_{ss}$ exclusively, because such a connection would increase the surface area of that grid, thus increasing the capacitance of that grid over that of the other grid. Preferably, the remnants are connected so that the final total surface areas of the two grids are equal.

Equalizing the surface areas tends to equalize the impedences of the two power grid-planes and the ground grid-plane. Equalizing the impedences reduces noise.

8. In general, a via will form a junction of two signal traces, as shown in FIG. 11. The junction provides four possible signal paths, 81-84. However, in general, only two of these paths will be used, such as 81 and 82. The other two (83 and 84) should be eliminated, as by cutting at line 85 in the case of path 84. The cut leaves a tail 86, which should be as short as possible, in order to minimize inductance. Preferably, the tail should be less than 100 μM. The remnant 77 should be connected to either $V_{dd}$ or $V_{ss}$, as discussed above.

9. There may be regions in which the signal traces 7 will not be flanked by the power grids; that is, in these regions, the signal traces can exist outside the unit cells of FIG. 10. Two such regions can be located (1) between the port 2 in FIG. 3 and the array of unit cells and (2) between the array of unit cells and the ICs. However, it is expected that these two regions will account for less than 5 to 10 percent of the length of the signal traces, and thus the signal traces can be viewed as substantially contained within the periodic array of unit cells.

10. The preceding discussion has assumed the use of signals having a fundamental frequency in the range of 25 MHz to 100 MHz. However, since the signals in question take the form of pulses, harmonics of the fundamental frequency will be present. Frequencies as high as 1000 MHz can be expected, and will be shielded to a large extent by the invention.

Numerous substitutions and modifications can be untertaken without departing from the true spirit and scope of the invention as defined in the following claims. What is desired to be secured by Letters Patent is the invention as defined in the following claims.

I claim:

1. In a carrier for supporting integrated circuits, which includes conductive traces which carry signals, the improvement comprising:
    a) several conductors which
        i) are interspersed among the traces,
        ii) are held at substantially constant dc potential, and
        iii) together with said conductive traces, occupy no more than two layers.

2. A carrier for integrated circuits, comprising:
    a) no more than two layers of conductors; and
    b) interconnections among the conductors such that
        i) some conductors can be used as signal conductors, and
        ii) other conductors can be used as power conductors which shield the signal conductors from each other.

3. A carrier for integrated circuits (ICs), comprising:
    a) a plurality of signal lines for carrying signals to and from the ICs and located on no more than two levels;
    b) for each signal line, a pair of conductors which
        i) flank the signal line and
        ii) carry power to ICs.

4. A carrier for integrated circuits (ICs), comprising:
    a) a substrate;
    b) a positive and a negative power supply grid, which together form a periodic array of unit cells; and
    c) signal traces interwoven through the periodic array, and connecting to the ICs.

5. An electronic device, comprising:
    a) several integrated circuits (ICs); and
    b) a carrier supporting the ICs;
    in which substantially all signal lines
        i) are supported by the carrier; and
        ii) have substantially constant characteristic impedance along their respective lengths.

6. An electronic device, comprising:
    a) several integrated circuits (ICs); and
    b) a carrier supporting the ICs;
    in which substantially all signal lines
        i) are supported by the carrier;
        ii) have substantially constant characteristic impedance along their respective lengths; and
        iii) have substantially identical characteristic impedances.

7. In a carrier for integrated circuits (ICs), a system for carrying signals between an entry port on the carrier and the ICs, comprising:
    a) a periodic array of substantially identical cells; and
    b) a network of signal lines interwoven through the cells.

8. In a carrier for integrated circuits (ICs), a system for carrying signals between an entry port on the carrier and the ICs, comprising:
    a) no more than two layers of conductive signal traces, interconnected to form
        i) a network of signal lines for interconnecting the ICs; and
        ii) a network of power lines, which deliver all power required by the ICs.

* * * * *

US 5,288,949 C1

(12) EX PARTE REEXAMINATION CERTIFICATE (4945th)
United States Patent
Crafts

(10) Number: US 5,288,949 C1
(45) Certificate Issued: Jun. 15, 2004

(54) CONNECTION SYSTEM FOR INTEGRATED CIRCUITS WHICH REDUCES CROSS-TALK

(75) Inventor: Harold S. Crafts, Colorado Springs, CO (US)

(73) Assignee: Hyundai Electronics America, San Jose, CA (US)

Reexamination Request:
No. 90/005,852, Nov. 6, 2000

Reexamination Certificate for:
Patent No.: 5,288,949
Issued: Feb. 22, 1994
Appl. No.: 07/829,838
Filed: Feb. 3, 1992

(51) Int. Cl.$^7$ ............................................. H05K 1/00
(52) U.S. Cl. .................. 174/250; 174/261; 174/117 FF; 174/260; 361/778
(58) Field of Search ......................................... 174/250

(56) References Cited

U.S. PATENT DOCUMENTS

| 4,866,507 A | 9/1989 | Jacobs et al. |
| 4,954,929 A * | 9/1990 | Baran ......................... 361/794 |

\* cited by examiner

Primary Examiner—Kamand Cuneo

(57) ABSTRACT

The invention concerns a Multi-Chip Module (MCM), which can be viewed as similar to a printed circuit board, but with the conductors interwoven in a 3-dimensional array. In the invention, the conductors are arranged such that both power supply conductors and ground conductors are interwoven around signal conductors, and provide shielding for the signal conductors, thus reducing cross-talk.

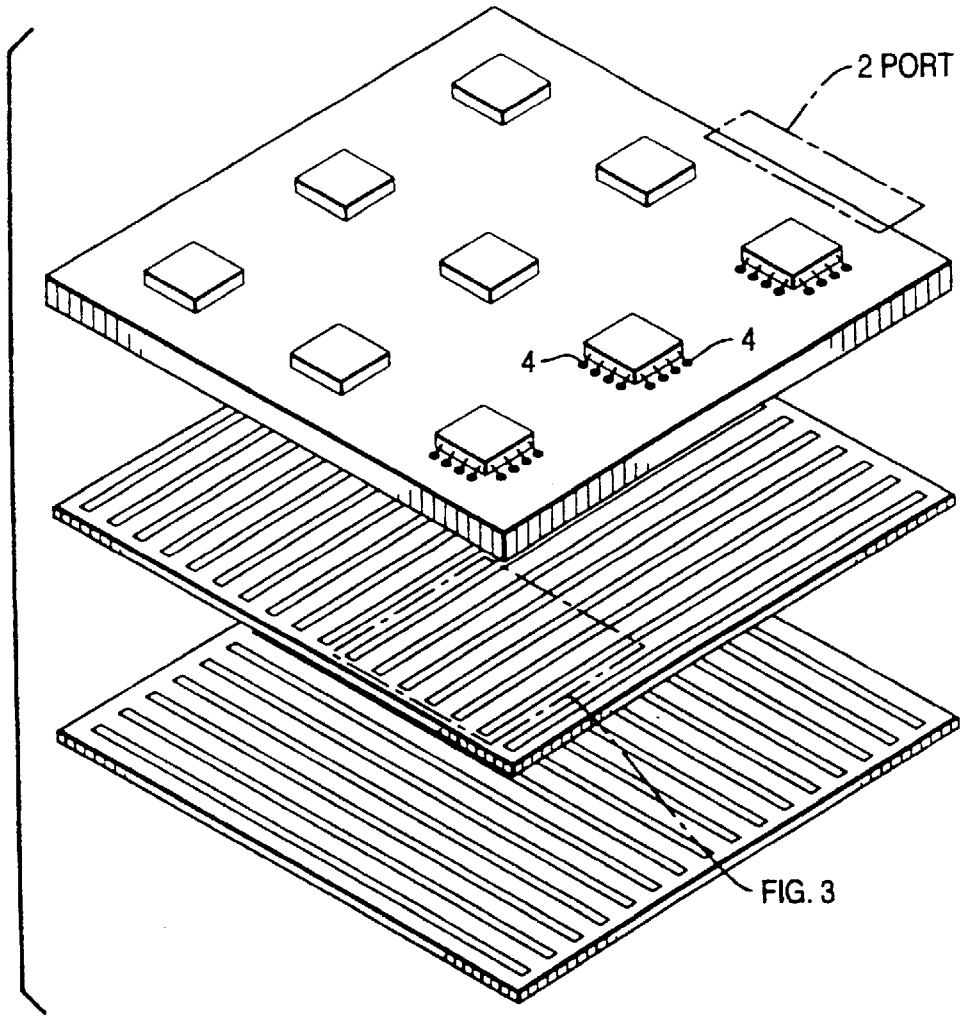

FIG. 3

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–8 are cancelled.

* * * * *